United States Patent [19]

Qualich

[11] Patent Number: 4,926,283

[45] Date of Patent: May 15, 1990

[54] TEMPERATURE PROTECTED TRANSISTOR CIRCUIT AND METHOD OF TEMPERATURE PROTECTING A TRANSISTOR

[75] Inventor: John Qualich, Wheeling, Ill.

[73] Assignee: Motorola Inc., Schaumburg, Ill.

[21] Appl. No.: 400,903

[22] Filed: Aug. 30, 1989

[51] Int. Cl.$^5$ ............................................. H02H 5/04
[52] U.S. Cl. ................................. 361/103; 230/207 P; 307/310
[58] Field of Search ................... 361/93, 103; 307/310; 330/207 P, 292

[56] References Cited

U.S. PATENT DOCUMENTS

| 4,345,218 | 8/1982 | Congdon et al. | 361/103 X |
| 4,355,341 | 10/1982 | Kaplan | 330/207 P X |
| 4,574,205 | 3/1986 | Nagano | 261/103 X |

Primary Examiner—Derek S. Jennings

[57] ABSTRACT

A method of and a circuit for temperature protecting a transistor (4) comprising:

a controlled voltage supply (34) for applying to the transistor a first voltage substantially less than a predetermined voltage required to render the transistor conductive at normal temperature;

a detector (8, 12, 18) for detecting whether the transistor conducts in response to the applied first voltage; and a controlled voltage supply (46), responsive to not detecting conduction of the transistor, for enabling the transistor by applying thereto a second voltage at least equal to the predetermined voltage, and, responsive to detecting conduction of the transistor, for disabling the transistor by removing the first voltage therefrom and inhibiting the application of the second voltage thereto so as to prevent damage thereto.

11 Claims, 1 Drawing Sheet

TEMPERATURE PROTECTED TRANSISTOR CIRCUIT AND METHOD OF TEMPERATURE PROTECTING A TRANSISTOR

INTRODUCTION

This invention relates to a temperature protected transistor circuit and a method of temperature protecting a transistor. The invention finds particular application in temperature protection of power field effect transistors (FETs).

DESCRIPTION OF PRIOR ART

It is desirable to protect power FETs from excessive junction temperature ($T_J$), e.g. in excess of 150° C. In a typical power FET the gate-to-source voltage ($V_{GS}$) threshold decreases in proportion to an increase in the junction temperature. For example, in Motorola, Inc.'s power FET type MTP25N05 at a drain current of 1 mA, $V_{GS}$ decreases linearly from 120% to 70% of its room temperature (25° C.) value as the junction temperature increases from −50° C. to +150° C. If the FET is operated at excessive temperature, damage may result.

Known temperature protected transistor circuits have incorporated additional temperature sensitive components such as diodes or thermistors positioned close to (e.g. fabricated within the same semiconductor die as) the transistor to be protected.

STATEMENT OF INVENTION

It is an object of the present invention to provide a temperature protected transistor circuit and a method of temperature protecting a transistor which do not require additional temperature sensitive components.

In accordance with a first aspect of the present invention there is provided a temperature protected transistor circuit, comprising:

a first transistor;

first means for applying to the transistor a first voltage substantially less than a predetermined voltage required to render the transistor conductive at normal temperature;

second means for detecting whether the transistor conducts in response to the first voltage applied by the first means; and third means, responsive to the second means not detecting conduction of the transistor, for enabling the transistor by applying thereto a second voltage at least equal to the predetermined voltage, and, responsive to the second means detecting conduction of the transistor, for disabling the transistor so as to prevent damage thereto.

In accordance with a second aspect of the present invention there is provided a method of temperature protecting a transistor, comprising the steps of:

applying to the transistor a first voltage substantially less than a predetermined voltage required to render the transistor conductive at normal temperature;

detecting whether the transistor conducts in response to the first voltage applied by the first means; and either:

enabling the transistor by applying thereto a second voltage at least equal to the predetermined voltage if the step of detecting does not detect conduction of the transistor, or disabling the transistor so as to prevent damage thereto if the step of detecting detects conduction of the transistor.

BRIEF DESCRIPTION OF DRAWINGS

One temperature protected transistor circuit and one method of temperature protecting a transistor in accordance with the present invention will now be described with reference to the accompanying drawings, in which.

DESCRIPTION OF PREFERRED EMBODIMENT

Figure 1:
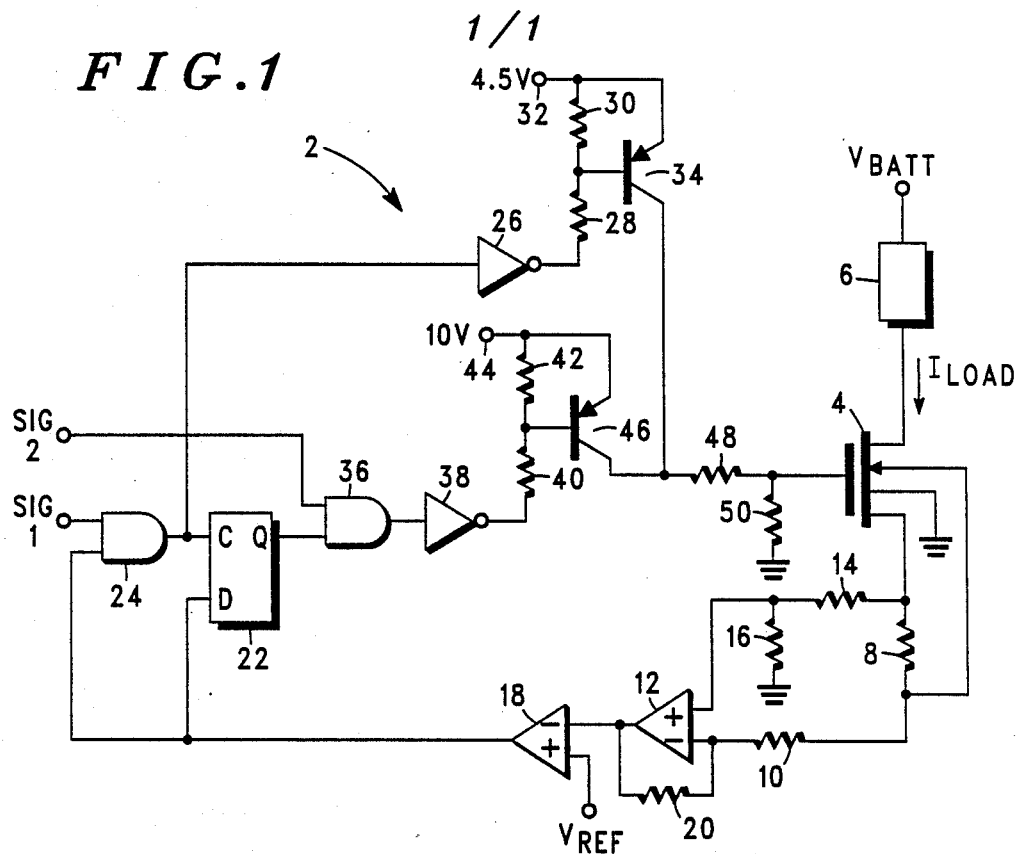
FIG. 1 shows a circuit diagram of the temperature protected transistor circuit.

Referring firstly to FIG. 1, a temperature protected transistor circuit 2 for providing a switching drive for PWM motor control in an automobile includes a switching power FET 4 (e.g. type MTP40N06M sold by Motorola, Inc.). The drain electrode of the FET 4 is connected in use to a load 6 (e.g. a motor winding) which is connected to an automotive battery voltage $V_{BATT}$. A first source electrode of the FET 4 is connected via series-connected resistors 8, 10 to an inverting input of a differential amplifier 12. A second source electrode of the FET 4 is connected to the mid-point of the resistors 8, 10 and to ground. The first source electrode is also connected to a non-inverting input of the differential amplifier 12 via a resistor 14. The non-inverting input of the differential amplifier 12 is also connected via a resistor 16 to ground. The output of the differential amplifier 12 is connected to a negative input of a comparator 18 and is also connected to the inverting input of the differential amplifier 12 via a resistor 20. A positive input of the comparator 18 is connected in use to a reference potential $V_{REF}$.

The output of the comparator 18 is connected to a data input D of a clocked latch 22 and to the lower input of a two-input AND gate 24. The output of AND gate 24 is connected to the clock input CL of the latch 22 and to an input of an inverter 26. The output of the inverter 26 is connected via series-connected resistors 28, 30 to a node 32 for receiving in use a supply at 4.5V. The node 32 is also connected to an emitter electrode of a pnp bipolar transistor 34, whose base electrode is connected to the common point of resistors 28, 30. The output of latch 22 is connected to the lower input of a two-input AND gate 36. The output of AND gate 36 is connected via an inverter 38 and series-connected resistors 40, 42 to a node 44 for receiving in use a supply at 10V. The node 44 is also connected to an emitter electrode of a pnp bipolar transistor 46, whose base electrode is connected to the common point of resistors 40, 42. The collector electrodes of transistors 34 and 46 are both connected via a resistor 48 to the gate electrode of the FET 4. The gate electrode of FET 4 is also connected via a resistor 50 to ground.

Essentially, the circuit of FIG. 1 uses the property of decreasing $V_{GS}$ threshold with increasing temperature to protect the FET 4 by turning the FET "on" by first applying approximately 80% of the 25° C. threshold voltage: if the FET does not turn "on" then the junction temperature is less than 100° C., whereas if the FET does turn "on" then the junction temperature is 100° C. or greater. In the former case a more substantial drive voltage is subsequently applied, while in the latter case the FET is latched "off" to prevent damage. A more detailed description of the operation of the circuit of FIG. 1 is given below.

Figure 2:
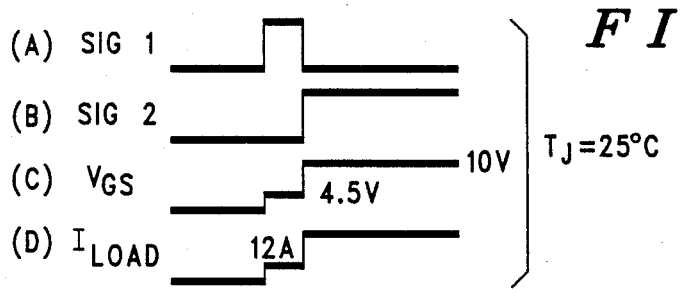
FIG 2 shows a group of waveforms of various voltages occurring in the circuit of FIG. 1 at a temperature of 25° C.
Figure 3:
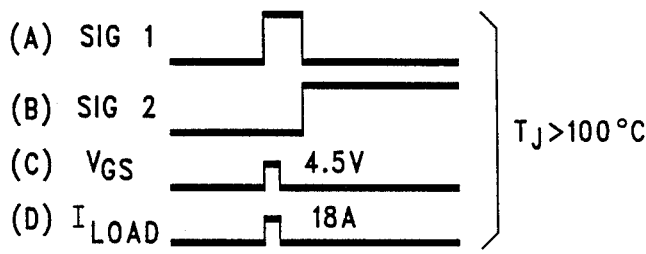
FIG. 3 shows a group of waveforms of various voltages occurring in the circuit of FIG. 1 at a temperature in excess of 100° C.

Referring now also to FIG. 2 and FIG. 3, in use of the circuit of FIG. 1, enabling input signals SIG1 and SIG2 as shown in FIG. 2(a) and (b) and FIG. 3(a) and (b) are applied respectively to the upper inputs of AND gates 24 and 36. The input signal SIG1 is a short "on" pulse preceding the full "on" signal SIG2. The input signals SIG1 and SIG2 are generated by simple additional circuitry (not shown). The switching FET 4 conducts current when sufficient gate-to-source voltage is applied. A voltage proportional to the current conducted is impressed across resistor 8. This voltage is buffered by differential amplifier 12 and compared in comparator 18 with the reference voltage $V_{REF}$ which is chosen such that a threshold exists at 18A of FET drain current. The comparator output is applied to the data input D of latch 22. The clock input CL of latch 22 receives the first input signal SIG1, ANDed with the comparator output; the output of AND gate 24 is coupled to apply 4.5V to the FET gate. The latch output Q is ANDed with the second input signal waveform SIG2 and coupled to apply 10V to the FET gate.

When SIG1 is applied, 4.5V will be supplied to the FET gate, as shown in FIG. 2(c) and FIG. 3(c), provided that $I_{LOAD}$ is less than 18A. If so, a logic "1" will be clocked into the Q output of the latch 22 on the falling edge of SIG1. This enables SIG2 to cause 10V to be applied to the gate of the FET 4, as shown in FIG. 2(c), fully turning it "on".

If, however, $I_{LOAD}$ exceeds 18A when SIG1 is high, the output Of the comparator 18 will go low, causing the output of AND gate 24 to go low and remove the 4.5V supply from the FET gate, as shown in FIG. 3(c). Also, latch output Q will be clocked low, which will inhibit the subsequent application of the 10V supply to the FET gate when SIG2 goes high. In this way the FET 4 is immediately disabled when current greater than 18A with 4.5V applied to the gate (indicative of excess temperature) in the FET 4 is sensed and the FET 4 is latched "off" so as to prevent the FET from operating at excess temperature.

It will be appreciated that various modifications or alternatives to the above described embodiment will be apparent to the person skilled in the art without departing from the inventive concept of protecting the transistor by turning the transistor "on" by first applying less than the "normal temperature" value (if the transistor does not turn "on" then the junction temperature is acceptable, whereas if the transistor does turn "on" then the junction temperature is unacceptably high), then applying a more substantial drive voltage if the temperature is acceptable or disabling the transistor to prevent damage if the temperature is unacceptably high.

I claim:

1. A temperature protected transistor circuit, comprising
    a first transistor;
    first means for applying to the transistor a first voltage substantially less than a predetermined voltage required to render the transistor conductive at normal temperature;
    second means for detecting whether the transistor conducts in response to the first voltage applied by the first means; and
    third means, responsive to the second means not detecting conduction of the transistor, for enabling the transistor by applying thereto a second voltage at least equal to the predetermined voltage, and, responsive to the second means detecting conduction of the transistor, for disabling the transistor so as to prevent damage thereto.

2. A circuit according to claim 1 wherein the third means is responsive to the second means detecting conduction of the transistor to remove the first voltage from the transistor and to inhibit the application of the second voltage thereto.

3. A circuit according to claim 1 wherein the first means comprises first voltage supply means for applying the first voltage to the transistor responsive to a first input signal.

4. A circuit according to claim 3 wherein the first voltage supply means comprises a second transistor having a first current electrode coupled to a source of first voltage, a second current electrode coupled to a control electrode of the first transistor, and a control electrode coupled to a node for receiving the first input signal.

5. A circuit according to claim 1 wherein the second means comprises: sensing means coupled to the first transistor for producing a sense signal representative of the current conducted by the first transistor; and comparator means coupled to the sensing means for comparing the level of the sense signal with a predetermined level.

6. A circuit according to claim 1 wherein the third means comprises: latch means having a data input coupled to the second means; and second voltage supply means coupled to an output of the latch means for applying the second voltage to the transistor responsive to a second input signal.

7. A circuit according to claim 6 wherein the second voltage supply means comprises a third transistor having a first current electrode coupled to a source of second voltage, a second current electrode coupled to a control electrode of the first transistor, and a control electrode coupled to the output of the latch means.

8. A circuit according to claim 6 further comprising: first logical AND means having a first input coupled to receive a first input signal, a second input coupled to the second means, and an output coupled to the first transistor and to a clock input of the latch means; and second logical AND means having a first input coupled to receive a second input signal, a second input coupled to the output of the latch means, and an output coupled to the first transistor.

9. A circuit according to claim 1 wherein the first transistor is a field effect transistor.

10. A temperature protected transistor circuit, comprising
    a field effect transistor having a gate electrode;
    a resistance connected in series with the field effect transistor for sensing current conducted thereby;
    a comparator having one input coupled to the resistance, another input coupled to a node for receiving a reference signal, and an output;
    a latch having a data input coupled to the comparator output, a clock input, and an output;
    a first AND gate having one input coupled to a node for receiving a first input signal, another input coupled to the comparator output, and an output coupled to the latch clock input;
    a second AND gate having one input coupled to a node for receiving a second input signal, another input coupled to the latch output, and an output;

first control means coupled to the first AND gate output for controlling the application to the field effect transistor gate electrode of a first voltage substantially less than a predetermined voltage required to render the transistor conductive at normal temperature; and second control means coupled to the second AND gate output for controlling the application to the field effect transistor gate electrode of a second voltage at least equal to the predetermined voltage, whereby in response to the first input signal the first control means applies to the field effect transistor a voltage less than that required to render the field effect transistor conductive at normal temperature, and if the resistance senses a current conducted by the field effect transistor greater than a reference value the second control means renders the field effect transistor non-conductive and alternatively in response to the second input signal the second control means renders the field effect transistor fully conductive.

11. A method of temperature protecting a transistor, comprising the steps of:

applying to the transistor a first voltage substantially less than a predetermined voltage required to render the transistor conductive at normal temperature;

detecting whether the transistor conducts in response to the first voltage applied by the first means; and either:

enabling the transistor by applying thereto a second voltage at least equal to the predetermined voltage if the step of detecting does not detect conduction of the transistor, or disabling the transistor so as to prevent damage thereto if the step of detecting detects conduction of the transistor.

* * * * *